(12) United States Patent
Stein (10) Patent No.: US 7,382,304 B2
(45) Date of Patent: Jun. 3, 2008

(54) SAMPLING AND MEASUREMENT OF PERIODIC SIGNALS

(75) Inventor: Anatoli Stein, Atherton, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 11/580,523

(22) Filed: Oct. 13, 2006

(65) Prior Publication Data

US 2007/0109159 A1 May 17, 2007

Related U.S. Application Data

(60) Provisional application No. 60/727,109, filed on Oct. 13, 2005.

(51) Int. Cl.
*H03M 1/12* (2006.01)

(52) U.S. Cl. .................. 341/155; 341/118; 341/167

(58) Field of Classification Search ............... 341/155, 341/118, 167
See application file for complete search history.

(56) References Cited

U.S. PATENT DOCUMENTS

| 5,612,698 | A  | * | 3/1997  | Reay | ............... 341/167 |
| 5,812,077 | A  | * | 9/1998  | Boie | ............... 341/118 |
| 6,366,803 | B1 | * | 4/2002  | Fee  | ............... 600/509 |
| 6,653,965 | B2 | * | 11/2003 | Ikai | ............... 341/155 |

* cited by examiner

*Primary Examiner*—Jean B Jeanglaude
(74) *Attorney, Agent, or Firm*—Van Pelt, Yi & James LLP (57) ABSTRACT

A periodic signal is sampled. The sampling frequency is less than the Nyquist rate of the periodic signal. A period of the periodic signal is determined. A phase of the periodic signal is tracked to determine a sample's position on the period of the periodic signal. A replica of the periodic signal is reconstructed. A measurement of the periodic signal is determined based on a measurement of the replica of the periodic signal.

19 Claims, 9 Drawing Sheets

SAMPLING AND MEASUREMENT OF PERIODIC SIGNALS

CROSS REFERENCE TO OTHER APPLICATIONS

This application claims priority to U.S. Provisional Patent Application No. 60/727,109 entitled SAMPLING AND MEASUREMENT OF PERIODIC SIGNALS filed Oct. 13, 2005 which is incorporated herein by reference for all purposes.

BACKGROUND OF THE INVENTION

High-frequency analog and digital signals (in the bandwidth of 10 GHz and above) are typically analyzed using a real-time digital oscilloscope or a sampling oscilloscope. However, both types of oscilloscope are expensive. Also, a real-time oscilloscope can introduce interpolation errors because the oscilloscope cannot acquire enough samples compared to the frequency content of the signal to be analyzed to make an accurate measurement. In addition, these oscilloscopes can require an external clock, a recovered clock, knowledge of the signal frequency, or an external trigger signal synchronous with the analyzed signal in order to appropriately analyze a signal. It would be useful to be able to analyze these signals using a less expensive device without requiring knowledge of the signal frequency or having a synchronized trigger signal.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Sampling and measuring a periodic signal is disclosed. A periodic signal is sampled. The sampling frequency is less than the Nyquist rate of the periodic signal. A period of the periodic signal is determined. A phase of the periodic signal is tracked to determine a frequency-drift corrected period using the detected period. The sample's position in the period of the periodic signal is determined. A replica of the periodic signal is reconstructed. A measurement of the periodic signal is determined based on a measurement of the replica of the periodic signal.

In some embodiments, the periodic signal comprises a signal from a magnetic hard drive analyzer. For example, a test pattern written to a magnetic test media and is read from the test media using a magnetic media and magnetic head tester. In some cases, the test pattern is written periodically on the media or at random intervals on the media to measure the media or head characteristics.

The sampling of a periodic signal is used to sample 10 GHz or greater bandwidth input signals using 1-2 GHz sampling analog-to-digital converters. A plurality of channels sampling a periodic signal at 1-2 GHz using slightly different frequencies or the same frequency but slightly different phases enables an effective 10 GHz or higher effective sampling of the signal. The slightly different frequency sampling using the plurality of channels allows the sampling to slide along the input periodic signal waveform.

In some embodiments, each channel has a separate clock where the separate clocks are different from each other enabling the sampling of the channels to capture different points along the periodic test pattern. The clocks can be set in a variety of way including: 1) to enable the measurement of the bit spacing of the measured test pattern, 2) to enable the measurement of the bit pattern spacing, 3) to enable a measurement of points along the periodic signal that are closer in time to each other than an individual channel is capable of sampling at, 4) to enable the sample points to slide along the periodic signal by setting frequencies in the channels that are slightly different from each other and from the bit or bit pattern frequencies of the signal, 5) to enable the sample points of the different channels to have a sliding relation between each other by having different clock frequencies, 6) to enable the sample points of the different channels to have a fixed relation between each other by having the same frequency but with different phase offsets, or any other appropriate setting of the clocks to enable analysis of the signal.

Figure 1:
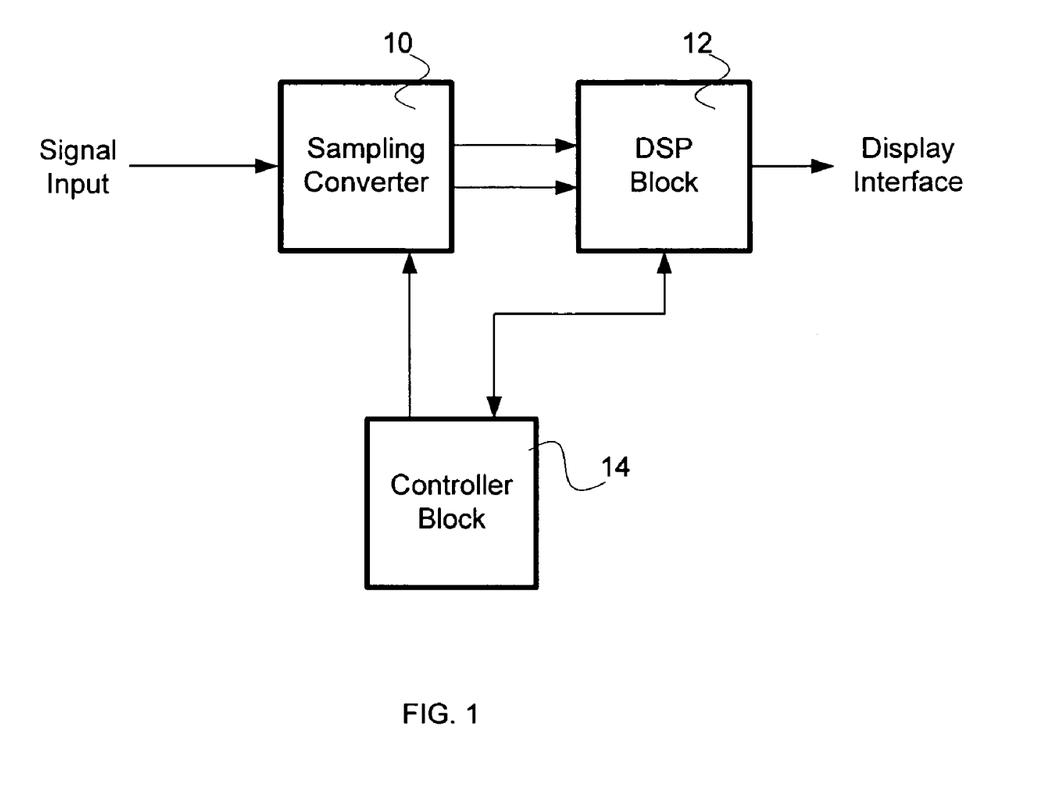
FIG. 1 is a block diagram illustrating an embodiment of a system for sampling and measuring a periodic signal.

FIG. 1 is a block diagram illustrating an embodiment of a system for sampling and measuring a periodic signal. In the example shown, a periodic signal is input to sampling converter 10. Sampling converter 10 digitally samples the input periodic signal using a plurality of samplers each with a sampling clock. The sampling clock is less than the bandwidth of the input periodic signal—for example, a 10 GHz bandwidth signal is sampled with a plurality of 1 GHz samplers. In this case, the samplers are sampling at less than the Nyquist rate (i.e., the minimum rate to reconstruct an arbitrary signal). In some embodiments, two samplers are used to sample the input periodic signal at two different frequencies or at the same frequency but with two different phases. The digital samples are output to DSP block 12. DSP block 12 determines a period of the periodic signal, a period of a pattern of the periodic signal, a phase of a distinctive pattern of the periodic signal, a frequency drift of the periodic signal, a replica of the periodic signal based on the samples, and measurements of the periodic signal based on the replica. DSP block 12 outputs information to a display regarding measurements of periodic signal including a replica of signal (e.g., eye diagram) and measurements (e.g., jitters, amplitudes, periods, frequencies, patterns, etc.). Controller 14 uses signals to control the system including a calibration mode, the clock frequencies for the samplers, phase error detection, frequency detection, replica assembly, gain and DC offset calibration for the analog-to-digital converters, delay line tuning for the samplers, and any other appropriate system function requiring control.

Figure 2:
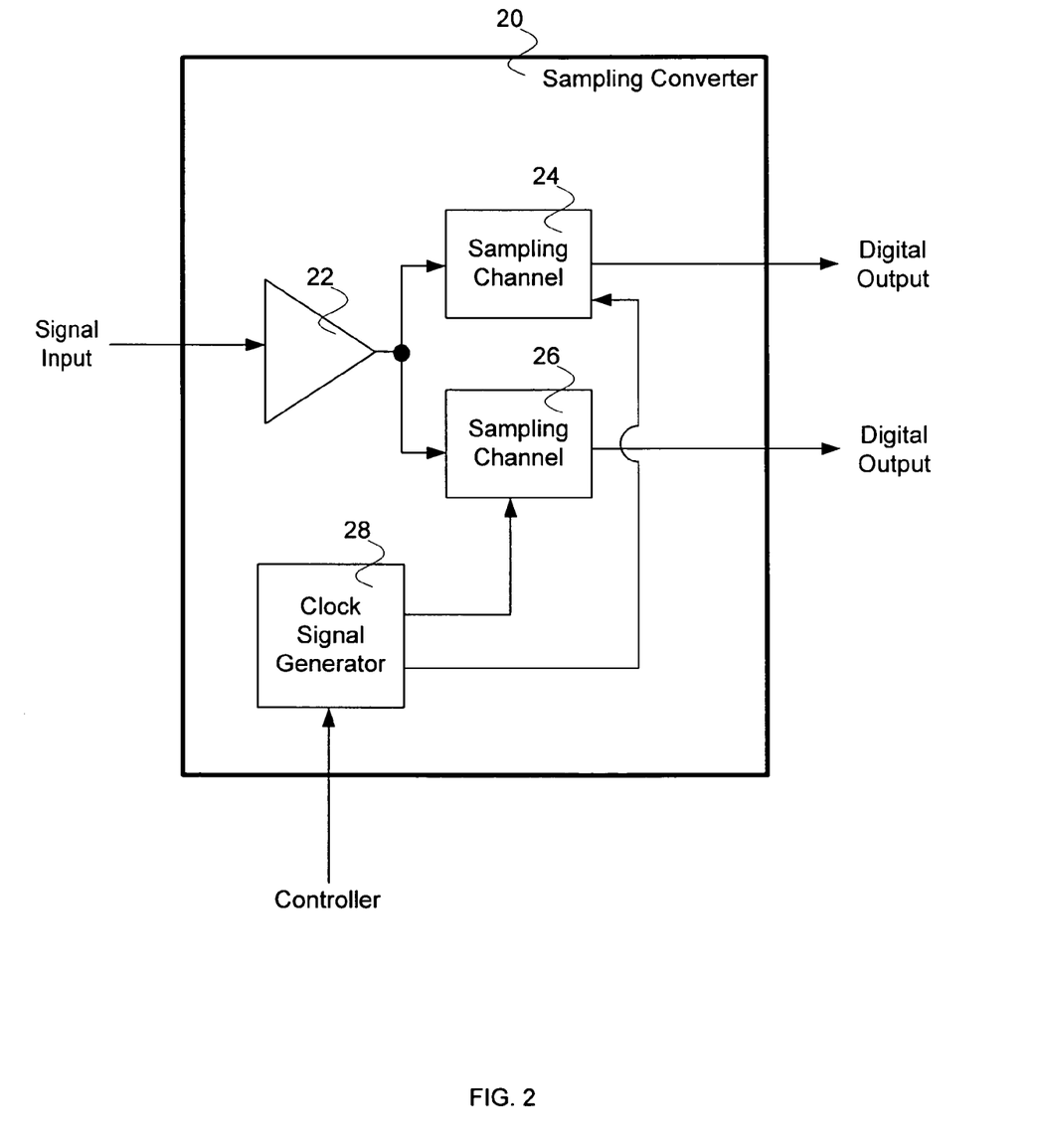
FIG. 2 is a block diagram illustrating an embodiment of a sampling converter.

FIG. 2 is a block diagram illustrating an embodiment of a sampling converter. In some embodiments, sampling converter 20 of FIG. 2 is used to implement sampling converter 10 of FIG. 1. In the example shown, sampling converter 20 includes buffer 22, a first sampling channel 24, a second sampling channel 26, and a clock signal generator 28. An input signal is buffered using buffer 22 before being sent to sampling channel 24 and sampling channel 26. Sampling channel 24 and sampling channel 26 each receive a separate clock from clock signal generator 28. Controller signals are used to set the clock frequencies for the sampling channels. Controller may also set a calibration mode, where the input signal is switched to a calibration signal from a sine wave generator and the sampling channels are tuned for gain, offset, and delays. Sampling channels produce digital output samples of the periodic signal. A periodic input signal is sampled at multiple clock frequencies to enable the reconstruction of a periodic input signal using samplers at a lower frequency than the input signal. The periodic input signal is reconstructed using the samples by placing the samples within the periodic window of the periodic signal. Corrections are made for a drifting frequency of the input periodic signal by tracking the drift in the periodic signal using distinctive features in the periodic signal and using a phase error derived from the distinctive features correcting a sample's location in the reconstructed periodic signal.

Figure 3:
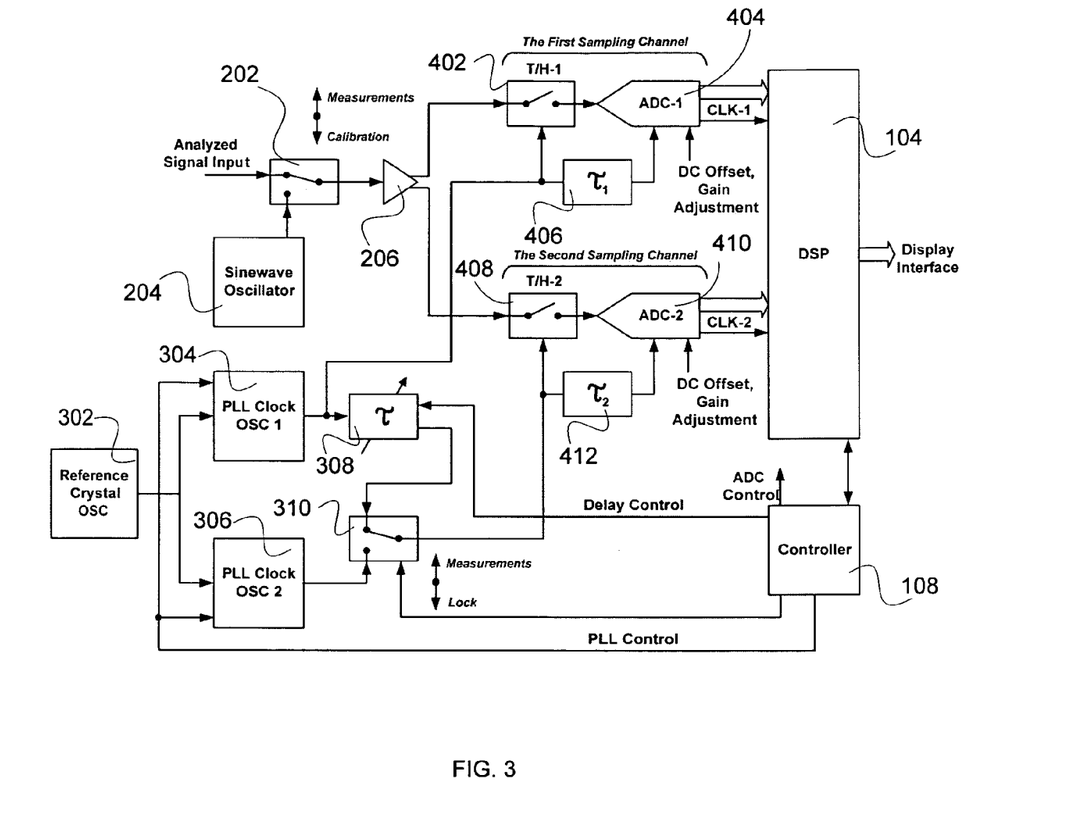
FIG. 3 is a block diagram illustrating an embodiment of a system for sampling and measuring a periodic signal.

FIG. 3 is a block diagram illustrating an embodiment of a system for sampling and measuring a periodic signal. In the example shown, a periodic signal is input to switch 202. Switch 202 also is passed the output of calibration signal generator 204. In some embodiments, calibration signal generator 204 generates for output one or more sine waves of a predetermined frequency and predetermined amplitude for calibrating clock delays, DC offsets, and gains of an ADC block (e.g., a 1 GHz tone that slides with respect to the frequency of PLL clock oscillator 1 with the speed of about 1% to 10%). Switch 202, depending on whether in calibration or measurement mode as indicated by a controller, selects the input periodic signal or calibration signal generator output to be passed to buffer 206. Buffer 206 is capable of outputting two buffered outputs. In some embodiments, more than two buffered outputs are produced.

In the example shown, the two buffered outputs are passed to two track-and-hold circuits 402 and 408. The two track-and-hold circuits are triggered based on two clock inputs, where each ADC channel (e.g., ADC channels 404 and 410) receives a separate clock input. The two track-and-hold circuits pass their output to an ADC, which are triggered based on a delayed version of the two clock inputs, where the delay is produced by the a delay block 406 and 412, respectively. The ADC channels each output samples and clock outputs to DSP block 104. Controller 108 inputs are used to set the clock delays, the DC offset and the gain for each ADC channel.

In the example shown in FIG. 3, the two phase lock loop (PLL) clock oscillators 304 and 306 are referenced to reference crystal oscillator 302. PLL clock oscillators are set by controller input to output a selected frequency—for example, two selected different frequencies or no frequency. In some cases, all PLL clock oscillators except for PLL clock oscillator 1 (304) are turned off, and the second clock output is generated by delaying by a predetermined amount (e.g., using an adjustable delay such as 308) the output of PLL clock oscillator 1 (304). Controller 108 input can select the delay for the adjustable delay. Controller 108 also selects the delayed PLL clock oscillator 1 output for clock output 2 or the corresponding PLL clock oscillator output using a switch, represented by switch 310. Controller 108 also can turn oscillators on and off, select PLL time constants, lock, etc.

DSP block 104 outputs information to a display regarding measurements of periodic signal including a replica of signal (e.g., eye diagram) and measurements (e.g., jitters, amplitudes, periods, frequencies, patterns, etc.).

Figure 4:
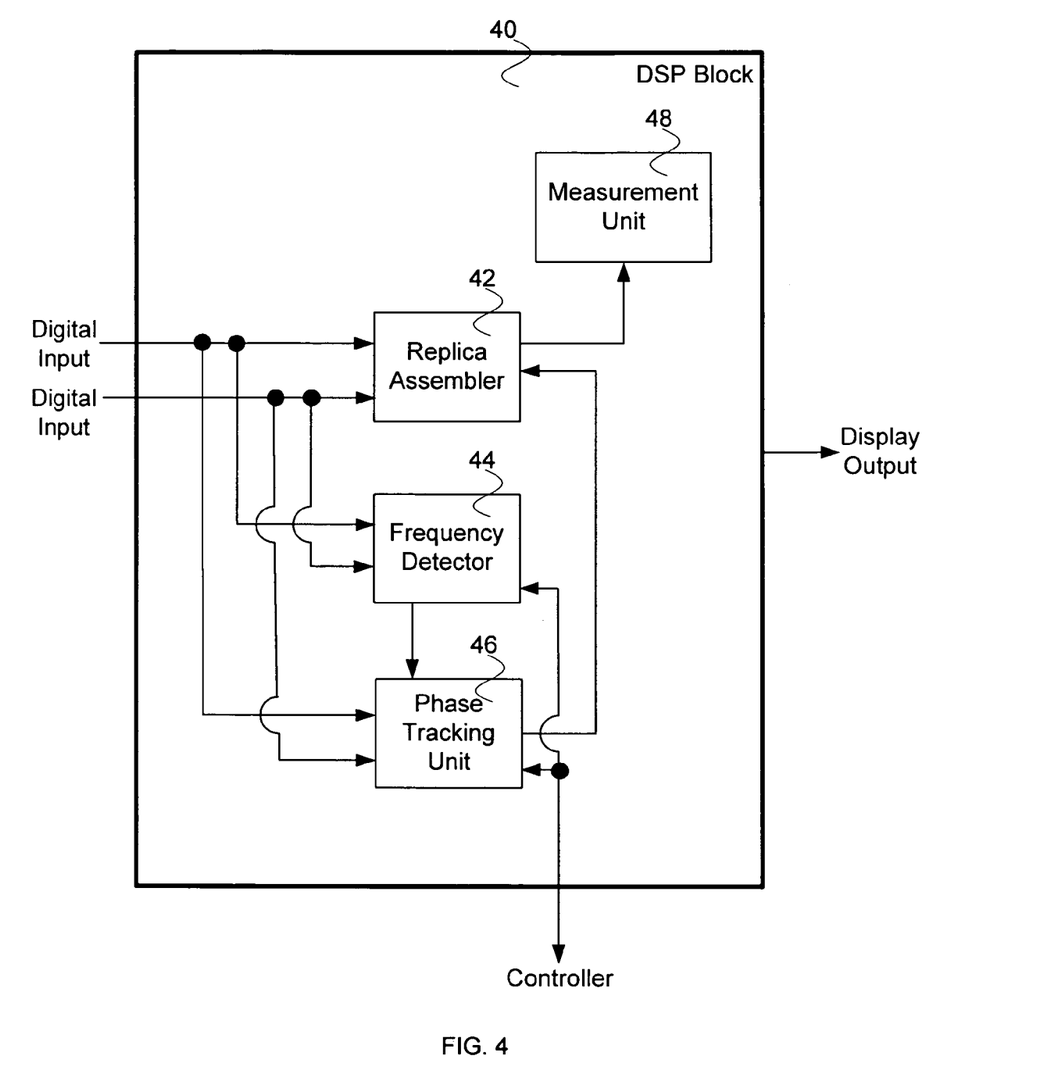
FIG. 4 is a block diagram illustrating an embodiment of a DSP block.

FIG. 4 is a block diagram illustrating an embodiment of a DSP block. In some embodiments, FIG. 4 is used to implement 12 of FIG. 1 and/or 104 of FIG. 3. In the example shown, DSP block 40 includes replica assembler 42, frequency detector 44, phase detector 46 and measurement unit 48. Two digital inputs from the sampling converter and a controller signal input/output are connected to replica assembler 42, frequency detector 44, and phase detector 46. Replica assembler 42 sends output (e.g., a replica of the periodic input signal) to measurement unit 48. Frequency detector 44 sends output (e.g., a start frequency signal) to phase detector 46. Phase detector 46 sends output (e.g., expected sample position) to replica assembler. DSP block 40 outputs information to a display.

Replica assembler 42 reconstructs a replica of a periodic input signal using samples from lower bandwidth samplers taking different samples using clocks with different frequencies/phases, detecting the period of the periodic signal, period within a periodic signal, and using these periods to place samples within a period of the signal. In some cases, period is adjusted based on a tracking of the frequency of the input periodic waveform.

Frequency detector 44 uses cross-correlation to determine the period of a periodic signal. Phase detector 46 calculates an expected sample position within the period of a periodic input signal by tracking the locations of distinctive features (e.g., zero-crossings, level changes, etc.) of the input periodic signal. Measurement unit 48 measures (e.g., jitter, amplitude, phase, width, period, pattern) the replica of the input periodic signal.

Figure 5:
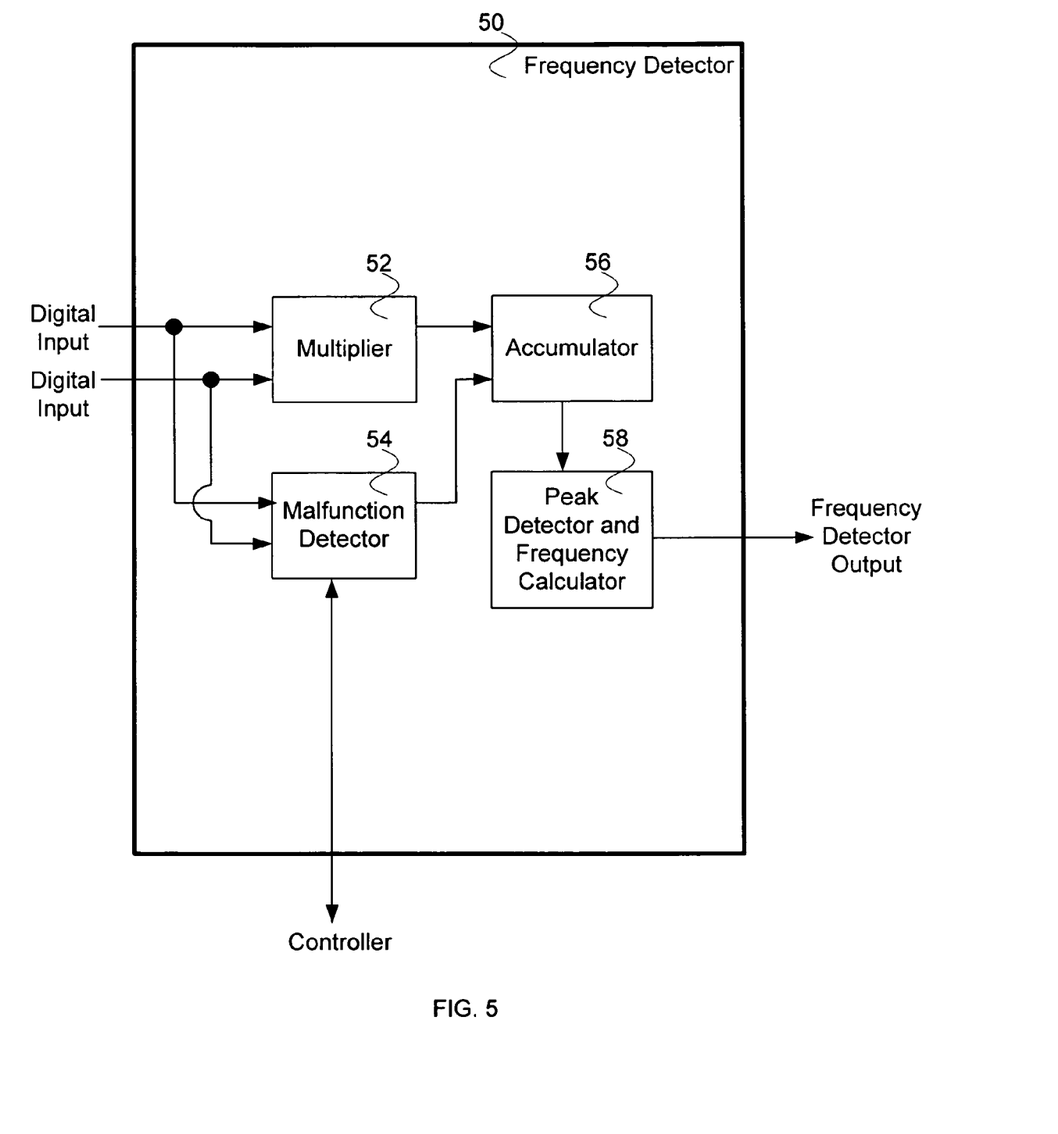
FIG. 5 is a block diagram illustrating an embodiment of a frequency detector.

FIG. 5 is a block diagram illustrating an embodiment of a frequency detector. In some embodiments, frequency detector 50 of FIG. 5 is used to implement frequency detector 44 of FIG. 4. In the example shown, two digital inputs from the sampling channels are input to multiplier 52 and malfunction detector 54. Multiplier 52 outputs to accumulator 56. Accumulator 56 outputs to peak detector and frequency calculator 58. Peak detector and frequency calculator 58 uses the peaks in the cross-correlation of the input samples as calculated by multiplier 52 and accumulator 56 to determine a period and a frequency of the periodic input signal. Malfunction detector 54 examines the range of the input samples to see if they are in a small range or a slowly drifting small range of amplitude. This may indicate that the input periodic signal is being sampled at close to an integer multiple of a period of the periodic signal. Malfunction detector 54 can indicate through the controller that a sampling frequency should be changed.

Figure 6:
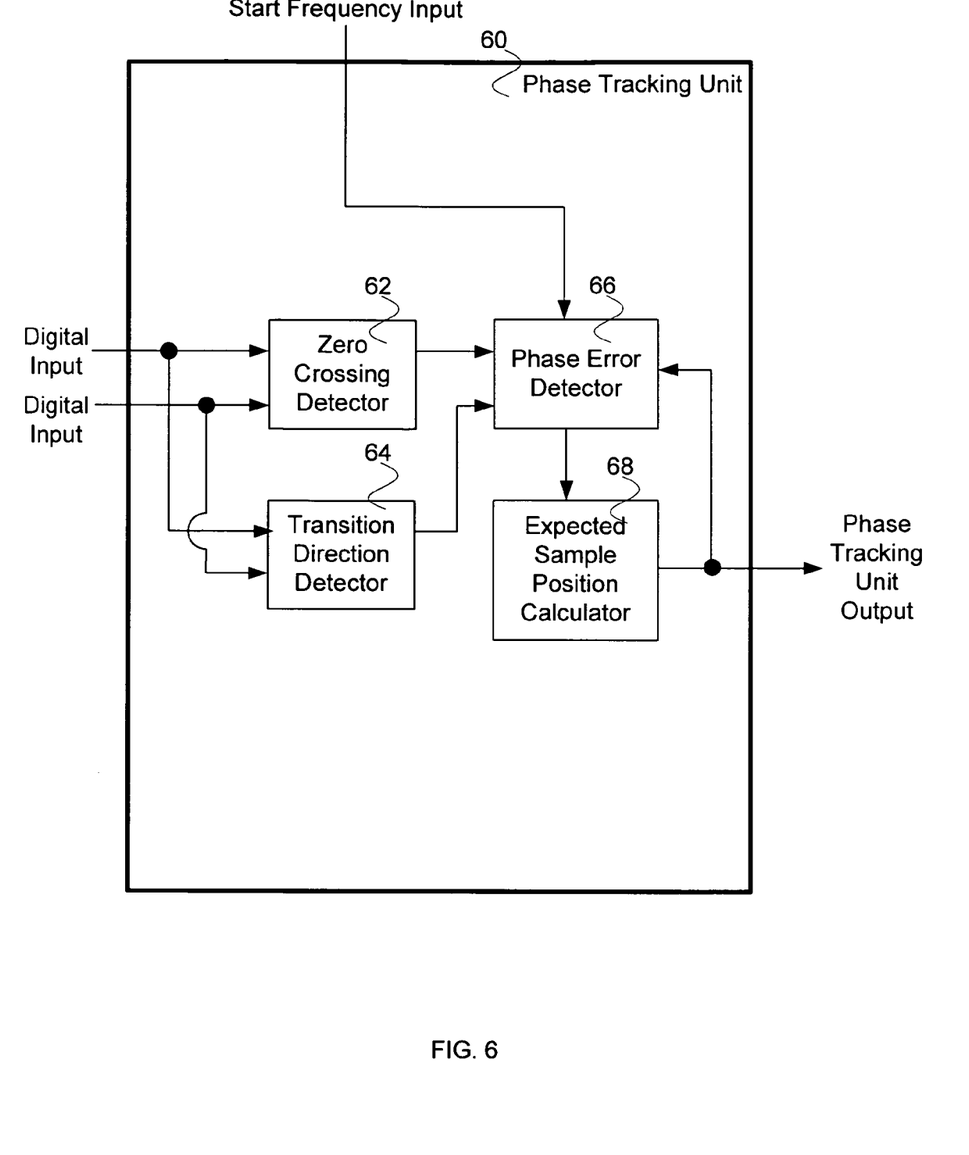
FIG. 6 is a block diagram illustrating an embodiment of a phase tracking unit.

FIG. 6 is a block diagram illustrating an embodiment of a phase tracking unit. In some embodiments, phase tracking unit 60 is used to implement phase tracking unit 46 of FIG. 4. In the example shown, digital input signals from two samplers are input to zero-crossing detector 62 and transition direction detector 64. Zero-crossing detector 62 and transition direction detector 64 send output into phase error detector 66. Phase error detector 66 compares the signal phase and the expected phase determined by the expected sample position calculator. The output of phase error detector 66 is used to correct the expected position of a sample within the period of a periodic input signal. Phase error detector 66 also receives a start frequency input.

Figure 7:
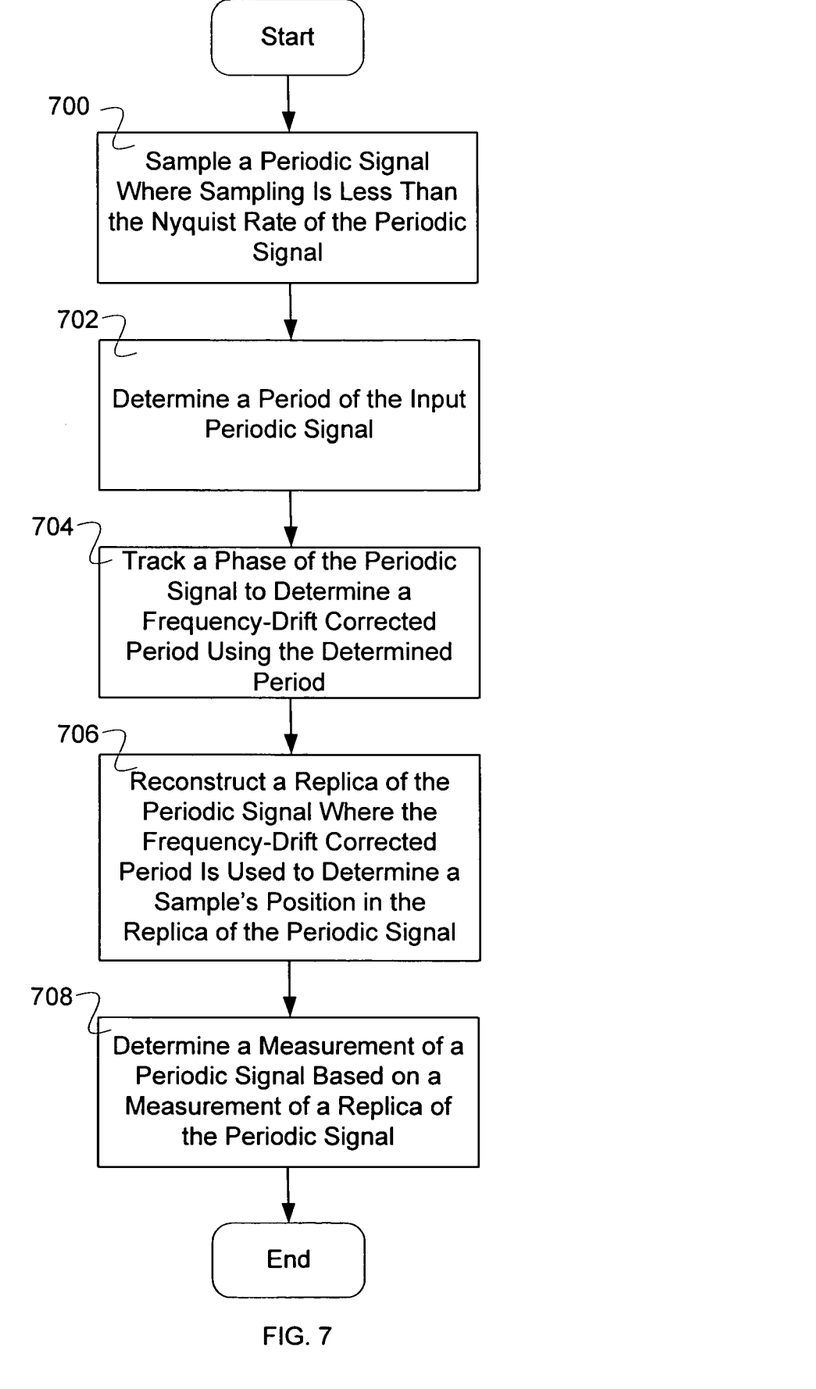
FIG. 7 is a flow diagram illustrating a process for sampling a periodic signal.

FIG. 7 is a flow diagram illustrating a process for sampling a periodic signal. In some embodiments, the process of FIG. 7 is executed using the system of FIG. 1. In the example shown, in 700 a periodic signal is sampled where the sampling frequency is less than the Nyquist rate of the periodic signal. In 702, a period of the periodic signal is determined. In 704, a phase of the periodic signal is tracked to determine a frequency-drift corrected period using the detected period. In 706, a replica of the periodic signal is reconstructed where the frequency-drift corrected period is used to determine a sample's position in the replica of the periodic signal. In 708, a measurement of the periodic signal is determined based on a measurement of the replica of the periodic signal.

In various embodiments, the separate sampling clocks for two channels have a single frequency; the separate sampling clocks for two channels each have a different phase delay; the separate sampling clocks for two channels have a different frequency; a separate sampling clock for a channel is changed in the event that each of a sequence of digitized values from the channel are within a predefined value range; the separate sampling clocks for two channels have frequencies that are different from each other so that a plurality of samples (e.g., 5 to 10) for a bit period are acquired enabling a determination of the bit period; the separate sampling clocks for each channel have frequencies that are different from each other so that one or more samples (e.g., 1) for a bit period are acquired enabling a determination of a bit pattern period; and/or the separate sampling clocks for two channels have a single frequency, and wherein the separate sampling clocks for the two channels each have a different phase delay (e.g., ⅕ to ​¹⁄₁₀ of a bit period) so that a zero crossing location interpolation can be performed and/or a measurement of a polarity of the zero crossing.

Figure 8A:
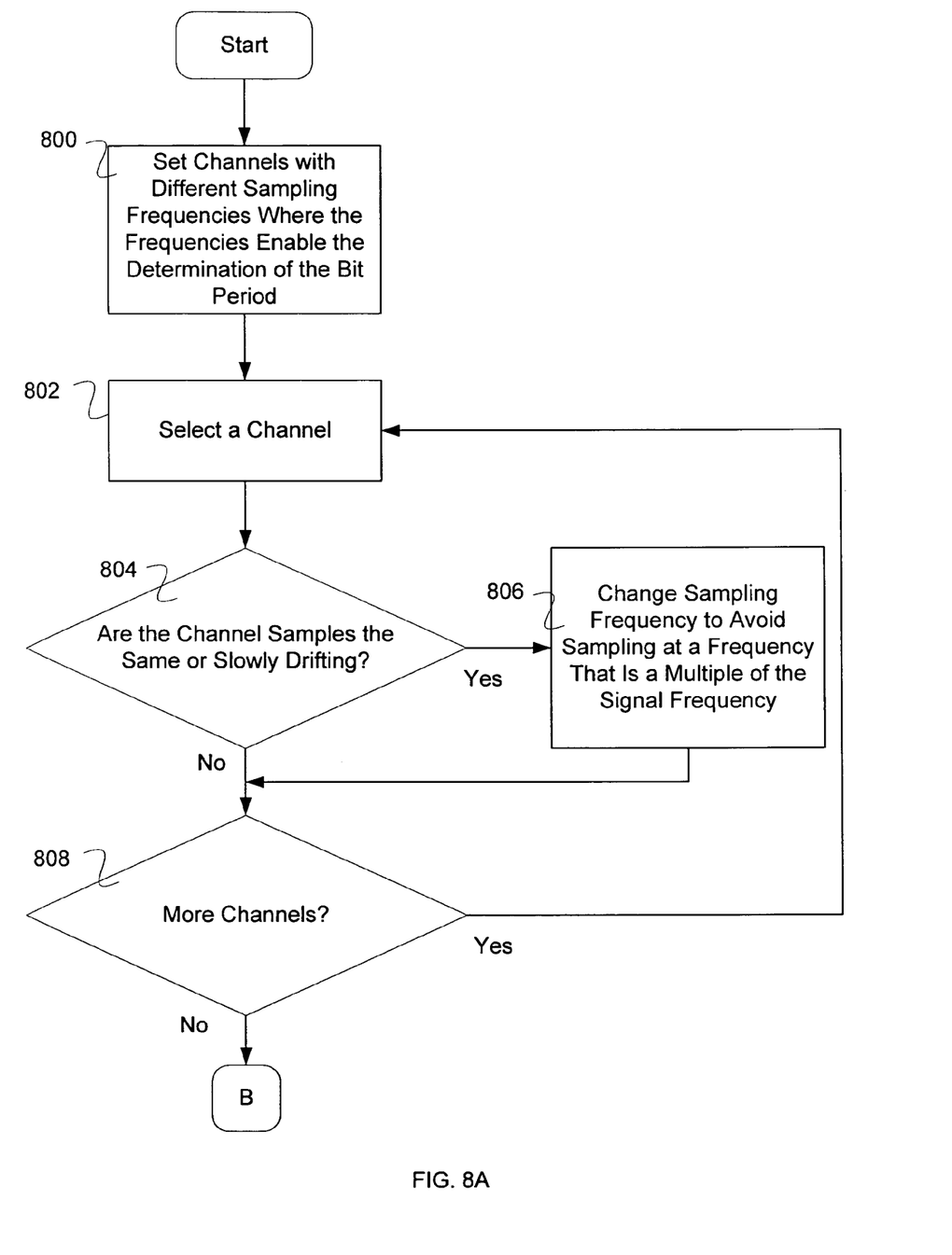
FIG. 8A is a flow diagram illustrating a process for sampling and measuring a periodic signal.
Figure 8B:
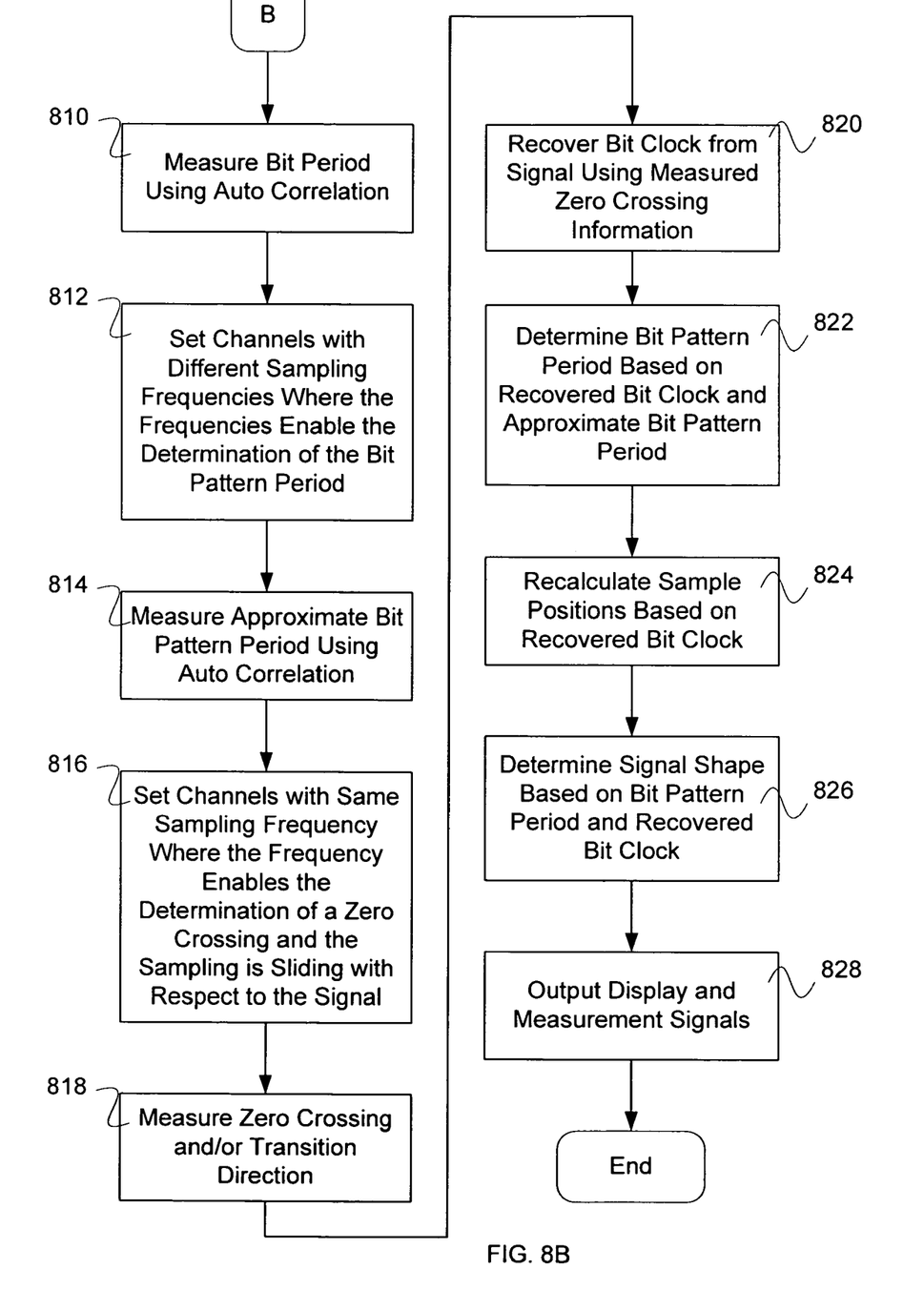
FIG. 8B is a flow diagram illustrating a process for sampling and measuring a periodic signal.

FIGS. 8A and 8B are flow diagrams illustrating a process for sampling and measuring a periodic signal. In some embodiments, the process of FIGS. 8A and 8B are executed using the system of FIG. 1. In the example shown, in 800 channels are set with different sampling frequencies where the frequencies enable the determination of the bit period. In some embodiments, the periodic signal input to the sampling system is a signal read from a magnetic hard drive media using a magnetic head. In some embodiments, the periodic signal is a bit pattern having a bit pattern period comprised of bits having a bit period. In some embodiments, the different frequencies are set close to each other to enable 5 to 10 samples per bit period so that a bit period measurement can be achieved. In 802, a channel is selected. In 804, it is determined if the channel samples are the same or slowly drifting. If the samples are the same or slowly drifting, then in 806, the sampling frequency for the channel is changed to avoid sampling at a frequency that is a multiple of the signal frequency, and control is passed to 808. If the samples are not the same or slowly drifting, then in 808 it is determined if there are more channels. If there are more channels (e.g., if there are two channels), then control passes to 802 and the next channel is selected. If there are not more channels, then control passes to 810.

In 810, the bit period is measured. A distance between autocorrelation peaks is used to measure the bit period. Other methods of measuring the bit period may also be used. In 812, channels are set with different sampling frequencies where the frequencies enable the determination of the bit pattern period. In some embodiments, the frequencies are set so that a few (e.g., one) samples are taken per bit period. In 814, approximate bit pattern period is measured using a measurement of a distance between autocorrelation peaks. In 816, channels are set with the same sampling frequency where the sampling frequency enables the determination of a zero crowing and the sampling is sliding with respect to the input periodic signal. In 818, zero crossings and/or transition direction are measured.

In 820, a bit clock is recovered from the signal using the measured zero crossing information. In 822, bit pattern period is determined based on the recovered bit clock and the approximate bit pattern period. In 824, sample positions are recalculated based on the recovered bit clock. In 826, signal shape is determined based on bit pattern period and recovered bit clock. In 828, display and measurement signals are output.

In some embodiments, two sampling channels are used to reconstruct a periodic signal with the following steps:

1. Find the bit period of the input periodic signal

Two sampling channels (e.g., a track-and-hold and an ADC) are run with asynchronous clocks with a relatively small difference in their clock frequencies. The difference in the clock frequencies defines the maximum frequency of the analyzed signal. For example, if the sampling frequency is about 1 GHz and the difference in the sampling frequency between the channels is 1%, then the distance between the sampling points will be changed 10 psec from period to period. This is sufficient to analyze an input signal with 10 GHz bandwidth (e.g., 100 psec period) with ten sample points per period. Because the distance between the samples is changed from sample to sample, an autocorrelation function can be calculated. The peaks of the autocorrelation function will mark the bit period of the input periodic signal for any pattern structure.

2. Find the bit pattern period of the input periodic signal

Same as above in step 1, the two sampling channels are run with the asynchronous clocks. The difference in the clock frequencies is increased in such a way that the distance between the samples in the two sampling channels is increased so that there is not more than one bit period of the input signal per sample clock. It can be less, but in that case the bit pattern measurements will take longer time. Again, an autocorrelation function can be calculated. Because the distance between the samples in the two sampling channels is changed approximately by one bit period, the bit-period autocorrelation function therefore has a small amplitude. The main peaks occur at the bit pattern period, and they define the length of the repetitive bit pattern.

3. Measure accurately the pattern period in presence of frequency instability of the input signal The bit pattern period measurement provides an accurate result only if the frequency of the analyzed signal is stable, or the bit pattern period is relatively short compare to the period of the frequency instability. For example, if the bit pattern length is 256 bits and the frequency instability is $10^3$, the error at the bit pattern's end will be about 0.25 of a bit length, and the quantity of bits in the pattern will be calculated properly. However, with the same example for a pattern length of 1024 bits, the error exceeds 1 bit length, and the pattern period will be incorrect.

In order to avoid this type of error, the bit pattern period measured above should be recalculated based upon the period of the bit clock recovered from the input signal. To recover the bit clock, both sampling channels are run with the same sampling frequency, which is selected such a way that the samples will "slide" along the analyzed signal with the speed calculated by the equation (1):

$$T_{clk} = nT_s \pm \frac{T_s}{N}, \text{ where} \qquad (1)$$

$T_{clk}$ is the period of the clock signal, n is the closest integer factor between the clock period $T_{clk}$ and the signal period $T_s$, and N is the required quantity of samples per period of the analyzed signal, which will be acquired during N periods of the signal.

(For example, if the period of the analyzed signal is 200 psec, the required quantity of the points per period is 10, and the clock frequency is about 1 GHz, then the real clock period is 1020 psec or 980 psec and the required frequency is 980 MHz or 1020 MHz.)

The phase of the clock of one of the sampling channels is shifted about 0.1-0.2 of the bit period of the input signal with respect to the clock of another sampling channel. This small shift between the clocks allows the system to find the bit transition and to define, for example, the zero crossing of the signal. This zero crossing can then be used to control a phase detector of a PLL that is used to recover the bit clock.

If the "sliding" speed, due to the difference between the bit frequency of the analyzed signal and the sampling frequency, is about 10%, the samplers will capture the zero crossings every 10-20 periods of the sampling frequency. This rate of zero-crossings is a high enough frequency for the PLL-based clock recovery circuitry to follow low-frequency changes (in kHz range) of an input signal. Because the distance between the samples from the two samplers is known, it is easy to recognize the polarity of each captured transition and to use both transitions—the positive and the negative—for the phase detector of the clock recovery.

Usually, the frequency of the PLL clock recovery circuitry is equal to the bit period of the input signal. The quantity of the recovered clocks inside the bit pattern period, measured above in step 2, accurately defines the quantity of the bits in the repetitive part of the pattern.

4. Signal restoration

After the bit period and the bit pattern period of the input signal are defined, and the clock recovery is performed, a replica of the input signal can be created. For this reconstruction, both sampling channels are run with the same sampling frequency and with the required "sliding" speed, with respect to the input signal calculated by the equation (1).

Knowledge of the bit period, the pattern period, and the sampling frequency is sufficient to create a reconstruction of the input signal shape. One problem can be that a frequency instability of the input signal generates errors in the position of the samples during the signal reconstruction. The longer the pattern period is, the larger this error will be. To make an accurate signal reconstruction, the position of each sample should be recalculated using the recovered clock from the clock recovery circuitry.

The description above is performed with the assumption that the analyzed signal is repetitive or periodic. In some embodiments, however, the input signal consists from repetitive sectors where the distance between these sectors is random. This can be the result of the actual generated pattern or a positioning error in a magnetic recording device while writing separate sectors. In spite of the random distance between the sectors, an input signal reconstruction and measurement can be performed.

In order to reconstruct this type of input signal, a preamble and/or an address mark should be added at the beginning of each sector. The clock recovery circuitry can obtain a lock to the input signal during the preamble. After this, the address mark can be detected. Using the address mark and the clock recovery signal, the input signal can be restored by combining the samples from different sectors just as a periodic input signal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for sampling and measuring a periodic signal comprising:
    sampling a periodic signal, wherein the sampling frequency is less than the Nyquist rate of the periodic signal;
    determining a period of the periodic signal;
    tracking a phase of the periodic signal to determine the sample's position in the period the periodic signal;
    reconstructing a replica of the periodic signal, wherein frequency-drift corrected period is used to determine a sample's position in the replica of the periodic signal; and
    performing a measurement of the periodic signal based on a measurement of the replica of the periodic signal.

2. A method as in claim 1, wherein detecting the period of the periodic signal comprises:
    sampling the periodic signal using two samplers with different clock frequencies;
    calculating a correlation function of the samples from the two samplers;
    determining the period of the periodic signal using a distance between peaks of the correlation function.

3. A method as in claim 2, further comprising:
checking a range covered by sample values from one of the two samplers to detect situations when the ratio of the periodic signal frequency and clock frequency of the one of the two samplers is close to an integer;
in the event that the ratio is detected to be close to an integer, changing a clock frequency of the one of the two samplers.

4. A method as in claim 1, wherein tracking the phase of the periodic signal comprises:
sampling the periodic signal using two samplers with the a first clock and a second clock, wherein the first clock and the second clock have the same frequency, and wherein there is a constant phase shift between the first clock and the second clock, and wherein the phase shift is a small part of the period of the first clock;
locating a periodically repeated distinctive element of the periodic signal using the samples of the two samplers;
determining a phase error using the location of the distinctive elements with respect to the period of the periodic signal;
altering the location of the period of the periodic signal based at least in part on reducing the phase error.

5. A method as in claim 1, wherein the periodic signal comprises a periodically repeated pattern with a predetermined number of bits.

6. A method as in claim 5, wherein detecting the period of the periodic signal comprises:
determining a bit length within the periodic signal using a first difference between the frequency of the first clock and the frequency of the second clock; and
determining a pattern period using a second difference between the frequency of the first clock and the frequency of the second clock, wherein the second difference is larger than the first difference.

7. A method as in claim 4, wherein the periodically repeated distinctive element of the periodic signal comprises a transition from one level of the signal to another level of the signal.

8. A method as in claim 7, wherein tracking the phase includes using the adjacent samples to determine a location and a direction of each transition found in the periodic signal.

9. A method as in claim 5, wherein the pattern period is recalculated using the tracking of the phase of the periodic signal.

10. A method as in claim 5, wherein the periodic signal comprises signals from a plurality of separate sectors, wherein the sectors are separated by a random space.

11. A method as in claim 10, wherein each sector includes a preamble for detecting a period of the periodic signal and an address mark for starting tracking of a phase of the periodic signal.

12. A method as in claim 2, further comprising sampling the periodic signal using one or more additional samplers.

13. An apparatus for sampling and measurement of a periodic signal comprising:
a sampling converter including an analog signal input, a control input and a digitable output, wherein the analog signal input comprises the input of the apparatus, wherein the sampling converter comprises:
a first sampling channel and a second sampling channel, each sampling channel including an analog signal input, a clock signal input, and a digital output;
a buffer amplifier including an input and two outputs, wherein the input comprises the input of the sampling converter, and wherein one of the two outputs is connected to the analog signal input of the first sampling channel and the other one of the two outputs is connected to the analog signal input of the second sampling channel; and
a clock signal generator including a control input and two clock signal outputs, wherein one of the two clock signal outputs is connected to the clock signal input of the first sampling channel, and the other one of the two clock signal outputs is connected to the clock signal input of the second sampling channel, and wherein the control input is connected to the control input of the sampling converter; and
a digital signal processor including a data input and a control input/output, wherein the data input is connected to the digital output of the sampling converter; and
a controller including a converter control output and a processor control input/output, wherein the converter control output is connected to the control input of the sampling converter and the processor control input/output is connected to the control input/output of the digital signal processor.

14. An apparatus as in claim 13, wherein each of the sampling channels comprises:
a track-and-hold circuit including a signal input, a clock input, and an output, wherein the signal input comprises the analog signal input of the sampling channel, and wherein the clock input is connected to the clock signal input of the sampling channel;
an analog to digital converter with means of DC offset and gain adjustment including a signal input, a clock input, and an output, wherein the signal input is connected to the output of the track-and-hold circuit, and wherein the output is connected to the digital output of the sampling channel; and
a delay line including an input and an output, wherein the input is connected to the clock signal input of the sampling channel, and wherein the output is connected to the clock input of the analog to digital converter.

15. An apparatus as in claim 13, wherein the clock signal generator comprises:
a reference crystal oscillator including an output;
a first PLL and a second PLL, each PLL including a clock input, a control input, and an output, wherein the clock input is connected to the output of the reference crystal oscillator, and wherein the control input is connected to an output of the controller, and wherein the output of the first PLL comprises the first clock signal output;
a variable delay line including a clock input, a control input, and an output, wherein the clock input is connected to the output of the first PLL, and wherein the control input is connected to an output of the controller; and
a switch including two clock inputs, a control input, and an output, wherein the first clock input is connected to the output of the variable delay line, and wherein the second clock input is connected to the output of the second PLL, and wherein the control input is connected to an output of the controller, and the output comprises second clock signal output.

16. An apparatus for sampling and measurement of a periodic signal comprising:
a sampling converter including an analog signal input, a control input and a digital output, wherein the analog signal input comprises the input of the apparatus;

a digital signal processor including a data input and a control input/output, wherein the data input is connected to the digital output of the sampling converter; and a controller including a converter control output and a processor control input/output, wherein the converter control output is connected to the control input of the sampling converter and the processor control input/output is connected to the control input/output of the digital signal processor; and a calibration switch, wherein the calibration switch is inserted between the input of the sampling converter and the input of the buffer amplifier enabling a sine wave oscillator to be connected to the input of the buffer amplifier for calibration.

17. An apparatus for sampling and measurement of a periodic signal comprising:

a sampling converter including an analog signal input, a control input and a digital output, wherein the analog signal input comprises the input of the apparatus;

a digital signal processor including a data input and a control input/output, wherein the data input is connected to the digital output of the sampling converter; and a controller including a converter control output and a processor control input/output, wherein the converter control output is connected to the control input of the sampling converter and the processor control input/output is connected to the control input/output of the digital signal processor; and wherein the digital signal processor comprises:

frequency detector including a data input, a control input/output, and an output, wherein the data input comprise data inputs of the digital signal processor, and wherein the control input/output is connected to an input/output of the controller;

a phase tracking unit including a data input, a start frequency input, a control input, and an output, wherein the data input is connected to the input of the digital signal processor, and wherein the start frequency input is connected to the output of the frequency detector, and wherein the control input is connected to an output of the controller;

a replica assembler including a data input, an expected sample position input, and an output, wherein the data input is connected to the data input of the digital signal processor, and wherein the expected sample position input is connected to the output of the phase tracking unit; and a measurement unit including a replica input, wherein the replica input is connected to the output of the replica assembler.

18. An apparatus as in claim 17, wherein the frequency detector comprises:

a multiplier including two inputs and an output, wherein the two inputs comprise the data input of the frequency detector;

a malfunction detector including a data input, a control input/output, and an output, wherein the data input is connected to the data input of the frequency detector, and wherein the control input/output is connected to the control input/output of the frequency detector;

an accumulator including a product input, a reset input, and an output, wherein the product input is connected to the output of the multiplier, and wherein the reset input is connected to the output of the malfunction detector; and a peak detector and frequency calculator including an input and an output, wherein the input is connected to the output of the accumulator, and wherein the output comprises the output of the frequency detector.

19. An apparatus as in claim 17, where in the phase tracking unit comprises:

a zero-crossing detector including an input and an output, wherein the input comprises the input of the phase tracking unit;

a transition direction detector including an input and an output, wherein the input is connected to the input of the phase tracking unit;

a phase error detector with a zero-crossing input, a direction input, an expected sample position input, a start frequency input, and an output, wherein the zero-crossing input is connected to the output of the zero-crossing detector, and wherein the direction input is connected to the output of the transition direction detector, and wherein the start frequency input being connected to the start frequency input of the phase tracking unit; and an expected sample position calculator including an input and an output, wherein the input is connected to the output of the phase error detector, and wherein the output comprises the output of the phase tracking unit and is connected to the expected sample position input of the phase error detector.

* * * * *